(12) United States Patent
Sirringhaus et al.

(10) Patent No.: US 7,105,854 B2
(45) Date of Patent: Sep. 12, 2006

(54) DOPING OF SOURCE-DRAIN CONTACTS

(75) Inventors: Henning Sirringhaus, Cambridge (GB); Richard Henry Friend, Cambridge (GB)

(73) Assignee: Plastic Logic Limited, Cambridge (GB)

( * ) Notice: Subject to any disclaimer, the term of this patent is extended or adjusted under 35 U.S.C. 154(b) by 133 days.

(21) Appl. No.: 10/693,100

(22) Filed: Oct. 27, 2003

(65) Prior Publication Data
US 2004/0192042 A1    Sep. 30, 2004

(30) Foreign Application Priority Data
Oct. 25, 2002  (GB)  .................... 0224871.4

(51) Int. Cl.
*H01L 21/00* (2006.01)
(52) U.S. Cl. .............. 257/40; 438/99; 257/E51.103; 257/E51.017; 257/E51.046
(58) Field of Classification Search .............. 257/40, 257/E51.013, E51.017, E51.046; 438/99
See application file for complete search history.

(56) References Cited

U.S. PATENT DOCUMENTS

| 2003/0059975 A1* | 3/2003 | Sirringhaus et al. | 438/99 |
| 2003/0164495 A1* | 9/2003 | Ong et al. | 257/40 |
| 2004/0002176 A1* | 1/2004 | Xu | 438/40 |
| 2004/0077122 A1* | 4/2004 | Wu et al. | 438/99 |

* cited by examiner

*Primary Examiner*—Michelle Estrada
(74) *Attorney, Agent, or Firm*—Sughrue Mion, PLLC

(57) ABSTRACT

A method for forming an electronic device on a substrate, the device including a first electrically conductive region, a second electrically conductive region spaced from the first electrically conductive region and a region of an semiconductor material between the first and second electrically conductive regions and in contact with the first electrically conductive region, the method comprising doping an interfacial zone comprising least part of the periphery of the semiconductor material at the interface between the semiconductor material and the first electrically conductive region by means of a dopant contained in the first conductive material and capable of doping the semiconducting material so as to thereby enhance the conductivity of the interfacial zone.

25 Claims, 7 Drawing Sheets

A

B

A

B

C

DOPING OF SOURCE-DRAIN CONTACTS

BACKGROUND OF THE INVENTION (1) Field of the Invention

This invention relates to electronic devices, especially solution-processed devices, and methods for forming such devices.

(2) Description of the Related Art

Semiconducting conjugated polymer thin-film transistors (TFTs) have recently become of interest for applications in cheap, logic circuits integrated on plastic substrates (C. Drury, et al., APL 73, 108 (1998)) and optoelectronic integrated devices and pixel transistor switches in high-resolution active-matrix displays (H. Sirringhaus, et al., Science 280, 1741 (1998), A. Dodabalapur, et al. Appl. Phys. Lett. 73, 142 (1998)). In test device configurations with a polymer semiconductor and inorganic metal electrodes and gate dielectric layers high-performance TFTs have been demonstrated. Charge carrier mobilities up to 0.1 cm$^2$/Vs and ON-OFF current ratios of 10$^6$–10$^8$ have been reached, which is comparable to the performance of amorphous silicon TFTs (H. Sirringhaus, et al., Advances in Solid State Physics 39, 101 (1999)).

In PCT/GB00/04934 techniques are disclosed that allow fabrication of polymer TFTs by a combination of direct printing and solution processing. These manufacturing techniques offer the possibility of inherently lower cost than inorganic semiconductor manufacturing techniques based on vacuum deposition and photolithographic patterning, and can be well suited for fabrication of low cost electronic circuits on large areas and flexible substrates.

One of the key factors that determines the performance of a polymer TFT is the parasitic contact resistance associated with the injection of charge carriers from the source electrode into the accumulation layer at the semiconductor-dielectric interface as well as the transport of the exiting charge carriers from the accumulation layer to the drain electrode. A finite contact resistance results in a fraction of the applied source-drain voltage dropping across the contacts and in a corresponding reduction of the transistor current, and the linear field-effect mobility, respectively. This is particularly relevant in the so-called linear regime of the transistor where the source-drain voltage is small compared to the gate voltage. A suppression of the current in the linear regime significantly degrades the switching speed of the TFT. In an active matrix display application, for example, the linear operating regime of the transistor determines the switching speed, as the voltage difference between the signal on the data line, and the voltage on the pixel to be addressed approaches zero.

Several factors may contribute to the source and drain contact resistances.

The conductivity of the conducting material that is in contact with the semiconducting polymer and forms the source and drain contacts.

The existence of insulating layers on the surface of the source-drain contacts, such as unintentional oxide layers.

At most metal-semiconductor interfaces a potential barrier exists. The shape of this potential barrier is determined by the difference between the Fermi energy of the metal and the ionisation potential (p-type semiconductor) and electron affinity (n-type), respectively, the image force experienced by a charge carrier in the semiconductor by image charges on the surface of the metal, as well as by the applied electric field. In normal operation of the TFT this so-called Schottky diode is reverse biased at the source, and forward biased at the drain.

In a device configuration where the source-drain contacts are formed on the same side of the semiconducting layer as the accumulation layer (see FIG. 1(a)) the Schottky potential barrier results in a short region between both the source and drain contacts and the accumulation layer in the channel in which no accumulation is possible, and in which the carrier concentration is low. In this region the current is ultimately limited by space-charge limited bulk conduction.

In a device configuration where the source-drain contacts are formed on the opposite side of the accumulation layer (see FIG. 1(b)) transport needs to occur through unaccumulated bulk of the semiconducting polymer layer. To minimize this contribution to the contact resistance the thickness of the semiconducting polymer film should be as small as possible.

In any particular device configuration several of the above factors might be contributing to the contact resistance, and the total parasitic contact resistance might be considered to be made up of a series combination of the individual contact resistances associated with the different factors.

One of the techniques that has been applied successfully to minimize contact resistance in inorganic semiconductor devices such as amorphous silicon (a-Si) TFTs is the use of highly-doped p$^+$ and n$^+$ semiconductor contacts. In the so-called inverted-staggered (bottom-gate) configuration of an a-Si TFT, the intrinsic a-Si semiconducting layer is formed directly on top of the SiN dielectric layer. Then a highly doped n$^+$ a-Si layer is deposited followed by the deposition of a metal layer such as Cr. The Cr and n$^+$ a-Si layer are then patterned by photolithography and subsequent wet (Cr) and dry etching (n$^+$ a-Si). In this structure efficient electron injection into the intrinsic a-Si layer is from n$^+$ a-Si source/drain contacts with Cr interconnects. The use of a highly doped semiconducting contact of the same material from which the semiconducting channel is formed minimizes both the height of the potential barrier and the width of any carrier depleted region at the contacts, and results in efficient carrier injection.

For inorganic semiconductor devices formation of the highly doped p$^+$/n$^+$ contacts to the semiconductor is usually associated with additional processing steps such as deposition of a highly doped layer, ion implantation steps and additional patterning steps. For polymer TFTs such processing steps are often difficult to perform, partly because of polymer degradation during ion implantation or solvent compatibility problems associated with photolithographic patterning. Furthermore, in general techniques to perform controlled doping with well-defined doping profiles are not established for polymer semiconductors.

SUMMARY OF THE INVENTION

The current application discloses methods for fabricating source-drain contacts, including methods for fabricating source-drain contacts in such a way that p+/n+ source-drain contacts are self-aligned with metallic interconnects and electrodes of a device; and a polymer transistor with highly doped p+/n+ source-drain contacts and controlled doping profiles. In the most preferred embodiments of the method, no additional patterning step is required to form the source-drain contact.

According to one aspect of the present invention there is provided a method for forming an electronic device on a substrate, the device including a first electrically conductive region, a second electrically conductive region spaced from the first electrically conductive region and a region of a semiconductor material between the first and second electrically conductive regions and in contact with the first electrically conductive region, the method comprising doping an interfacial zone comprising at least part of the periphery of the semiconductor material at the interface between the semiconductor material and the first electrically conductive region by means of a dopant integral with the first electrically conductive region and capable of doping the semiconductor material so as to thereby enhance the conductivity of the interfacial zone.

According to a second aspect of the invention there is provided an electronic device formed on a substrate and comprising: a first electrode constituted by a first electrically conductive region; a second electrode constituted by a second electrically conductive region and spaced away from the first electrode; a layer of a semiconductor material between the first and second electrodes and in contact with the first electrically conductive region, there being an interfacial zone comprising least part of the periphery of the semiconductor material at the interface between the semiconductor material and the first electrically conductive region in which the semiconductor material is doped by a dopant integral with the first electrically conductive region so as to have a higher electrical conductivity than the interior of the semiconductor material.

The dopant is preferably incorporated in the first electrically conductive region, most preferably dispersed throughout the body of that region. Such a dispersion is preferably substantially uniform. Alternatively it may be in the form of a layer over some or all of that region.

The first electrically conductive region may suitably be deposited from a solution including the dopant. The solvent may then be removed, e.g. by evaporation, to leave the electrically conductive material and the dopant.

Preferably the dopant is capable of diffusing from the first electrically conductive region to the interfacial zone so as to dope the interfacial zone.

The substrate may be annealed after the deposition of the first electrically conductive region and the region of semiconductor material. This may suitably enhance diffusion of the dopant into the semiconductor.

The dopant may be an oligomer of an organic molecule comprising an acid functional group, preferably an oligomer of an organic molecule containing a sulphonic acid group.

The dopant may be a surface active dopant, preferably a surfactant.

At least part of the surface of the first electrically conductive region may be roughened (e.g. so as to increase its surface area). The semiconductor material preferably contacts that part of the surface of the first electrically conductive region.

According to a further independent aspect of this invention there is provided a process of roughening the surface of the conducting material so as to increase the surface area of the material. Such a method can result in enhanced adhesive properties of the electrode.

The first electrically conductive region may be formed so as include a conducting material and a polymer. That may then be exposed to a solvent in which said polymer is soluble so as to dissolve at least some of the polymer and reveal the conductive material. Non-exposed conductive material will suitably remain in the bulk of the region.

The first electrically conductive region may contain a semiconductor material, preferably the same semiconductor material as the aforesaid semiconductor material.

The first electrically conductive region is deposited from a solution including molecules of a blockcopolymer having one or more electrically conductive blocks and one or more a semiconducting blocks.

A layer of the dopant may be formed on at least part of the surface of the first electrically conductive region. The semiconductor material may then be deposited in contact with that part of the surface of the first electrically conductive region. Such a layer of the dopant may be deposited by polyelectrolyte self-assembly.

Preferably either or both of the first and second electrically conductive regions comprises an electrically conductive polymer, for example PEDOT/PSS.

Preferably either or both of the first and second electrically conductive regions comprises a metal deposited from solution, for example silver, gold, or copper.

The semiconductor material may be an organic semiconductor, preferably a conjugated polymer. The semiconductor material may be an inorganic semiconductor, for example silicon or cadmium selenide. The ionisation potential of the semiconductor is preferably less than 5.8 eV.

Preferably the first and second electrically conductive regions constitute electrodes of the electronic device. The electronic device may be a switching device. The switching device may be a transistor and the electrodes may be source and drain electrodes of the transistor.

The semiconductor material suitably remains substantially undoped by the dopant internally of the interfacial/peripheral zone/layer.

The thickness of the peripheral zone is preferably greater than any one of 1 nm, 2 nm, 5 nm, 10 nm, 20 nm, 50 nm and 100 nm. The thickness of the peripheral zone is preferably less than any one of 3 µm, 1 µm, 500 nm, 200 nm and 100 nm.

The concentration of the dopant in the peripheral zone is preferably higher than $10^{17}$ cm$^{-3}$.

Preferably the conductivity of the organic semiconducting material is enhanced by doping throughout the peripheral layer. The peripheral layer may also be termed an interfacial layer. Most preferably the doping concentration throughout the interfacial layer is higher than $10^{17}$ cm$^{-3}$.

Preferably the interfacial layer is doped from the material of the conductive electrode adjacent the interfacial layer, most preferably by a component of that material. The dopant is preferably capable of diffusing into the semiconductive material to perform the doping. Steps may be taken to enhance such diffusion: for example the application of heat and/or an electrical potential.

The conductivity of the interfacial region is preferably enhanced relative to that of the remainder of the organic material and/or relative to its conductivity prior to doping.

The semiconductor layer preferably contacts both of the first and second electrodes. The semiconductor material may comprise a plurality of individual semiconductor materials (preferably semiconductive polymer compositions) which may be homogeneous (e.g. mixed) or segregated.

The device is preferably a switching device, most preferably a transistor. The electrodes preferably form the source and rain electrodes of the device. The semiconductor region is preferably the active switching layer of the device. There is preferably also a gate electrode arranged so as to influence the conductivity of the semiconductor region and thereby bring about switching by the semiconductor region.

BRIEF DESCRIPTION OF THE FIGURES

The invention will now be described by way of example with reference to the following figures.

DETAILED DESCRIPTION OF THE INVENTION

Figure 1:
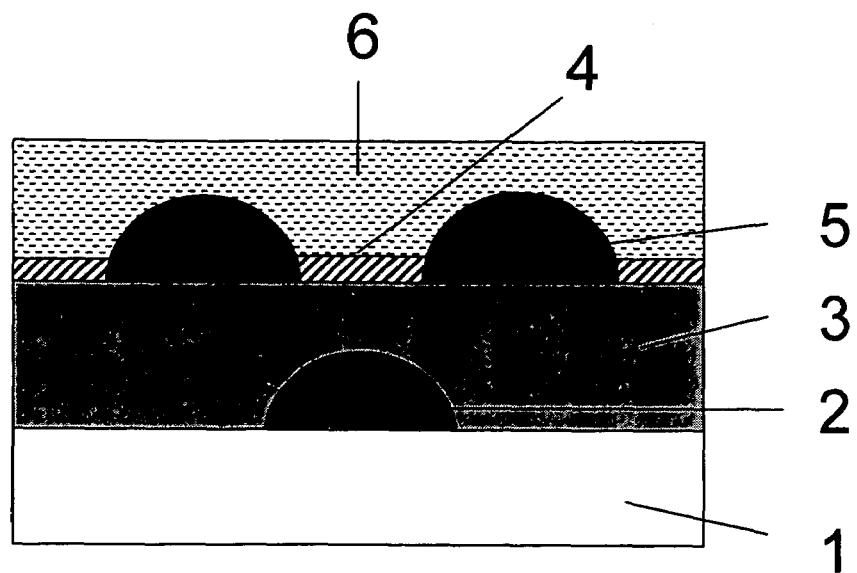
FIG. 1 shows conventional bottom-gate (a) and top-gate (b) configurations for a polymer TFTs.
Figure 1:
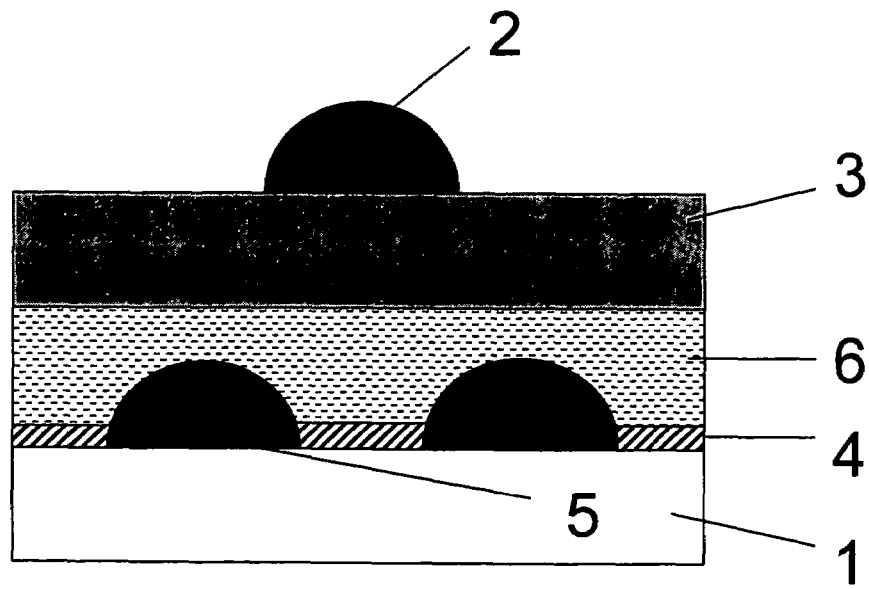
Figure 2:
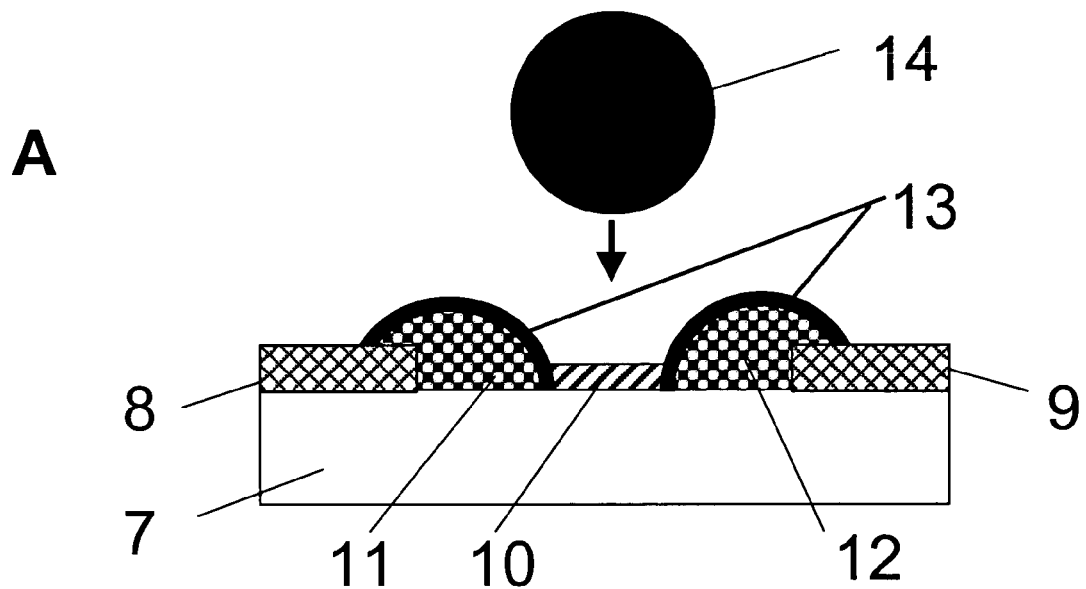
FIG. 2 shows the process for fabricating a top-gate polymer TFT with highly doped source-drain contacts formed by depositing a solution of a semiconducting polymer onto a previously deposited pattern of a conducting polymer.
Figure 2:
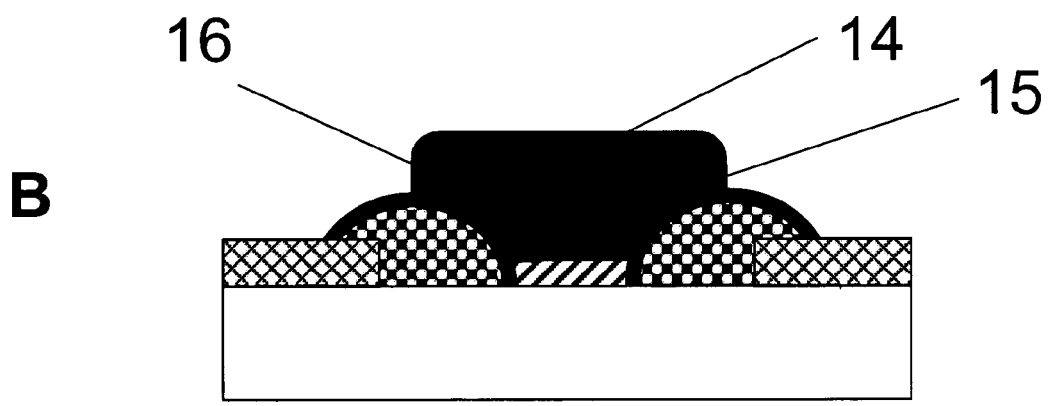
Figure 2:
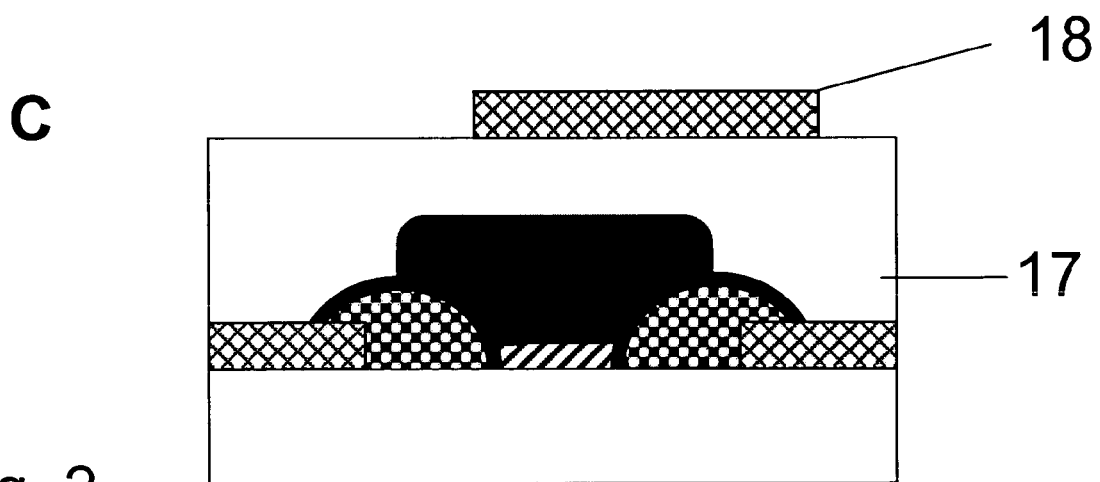

In one embodiment of the present invention (FIG. 2) a pattern of a conducting polymer 11 and 12 is first deposited onto the substrate. Deposition of the conducting polymer is preferably from solution. Examples for suitable deposition techniques are spin-coating, blade-coating or direct write techniques such as inkjet printing, offset printing or screen printing. The critical features of the conducting polymer pattern can be defined, for example, by photolithography or by solution deposition onto a high-resolution surface energy pattern 10 containing solution-repelling regions of low surface energy (PCT/GB00/04934). However, other patterning techniques might be used as well. The critical feature size between the conducting polymer patterns for source and drain 11 and 12 is preferably less than 20 µm. The conducting polymer can be in contact with an interconnect line 8,9 of an inorganic metal with a high conductivity, such as silver, copper, gold, tungsten, tantalum or indium tin oxide. The latter might be deposited and patterned by conventional vacuum deposition and photolithography although it is preferred if the inorganic metal is also deposited from solution, for example, using a nanoparticle dispersion or a chemical precursor. Deposition techniques such as inkjet printing, screen printing, electroless plating, laser forward transfer printing (UK 0116174.4) or other deposition and patterning techniques can be used. Inorganic metals can be solution deposited using, for example, from nanoparticle dispersions or chemical precursor solution. Usually, an annealing step is required in order to bring the as-deposited material into a high-conductivity state. In many applications of polymer TFTs a high conductivity metal to interconnect TFT devices or to connect the TFT devices/circuits to the outside world is required because conducting polymers have conductivities less than 1000 S/cm which is not sufficient for applications which require long interconnect lines and/or fast switching operation.

Figure 3:
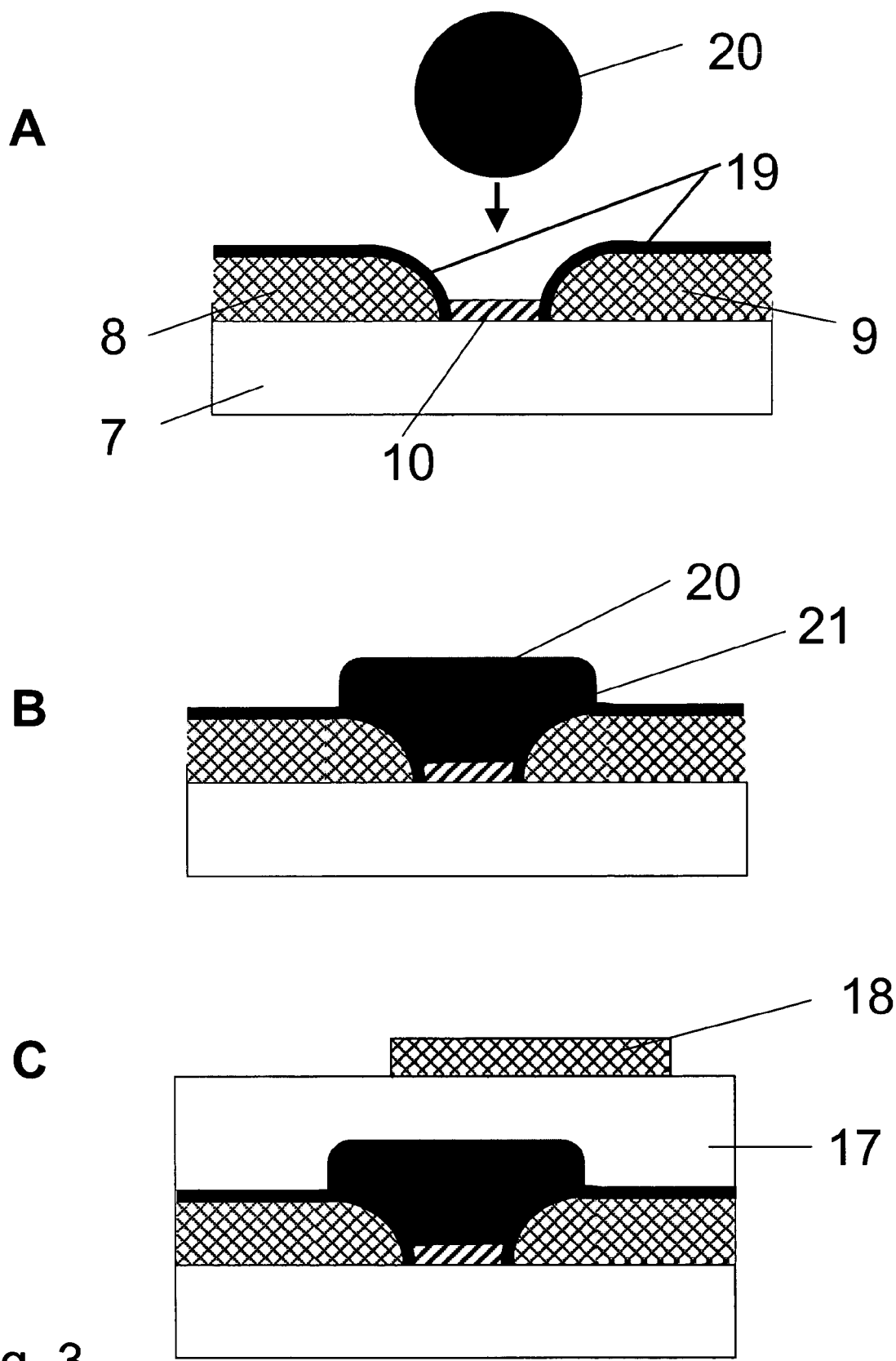
FIG. 3 shows the process for fabricating a top-gate polymer TFT with highly doped source-drain contacts by depositing a solution of a semiconducting polymer onto a previously deposited pattern of an inorganic metal deposited from solution.

An alternative structure is shown in FIG. 3. In this case the semiconducting polymer is in direct contact with the high conductivity interconnects/electrodes 8,9 without the intermediate conducting polymer electrode.

Figure 5:
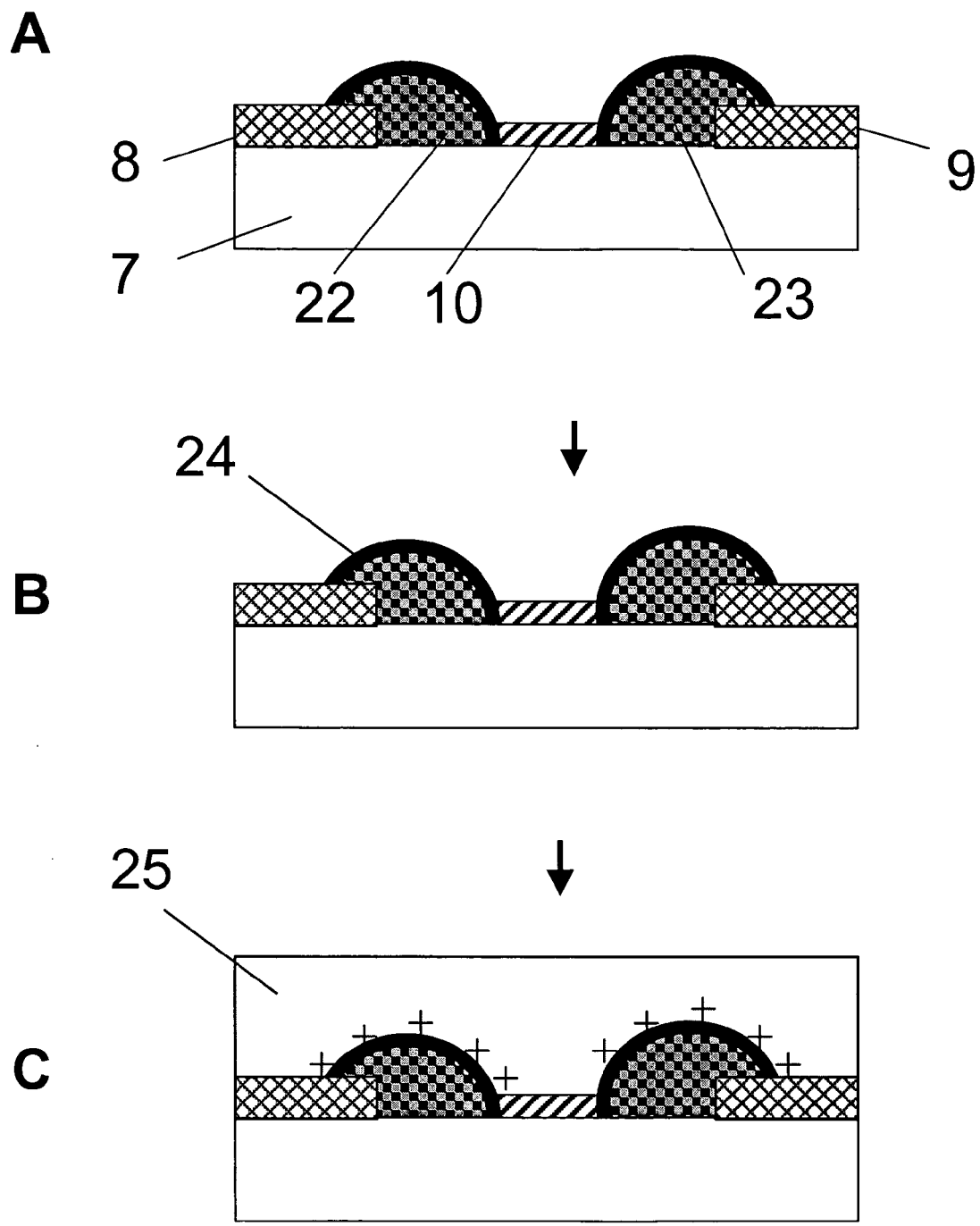
FIG. 5 shows a method for increasing the surface roughness of the conducting electrode by adding a surface active polymer or molecule to the ink of the conducting electrode, that can be redissolved selectively.
Figure 6:
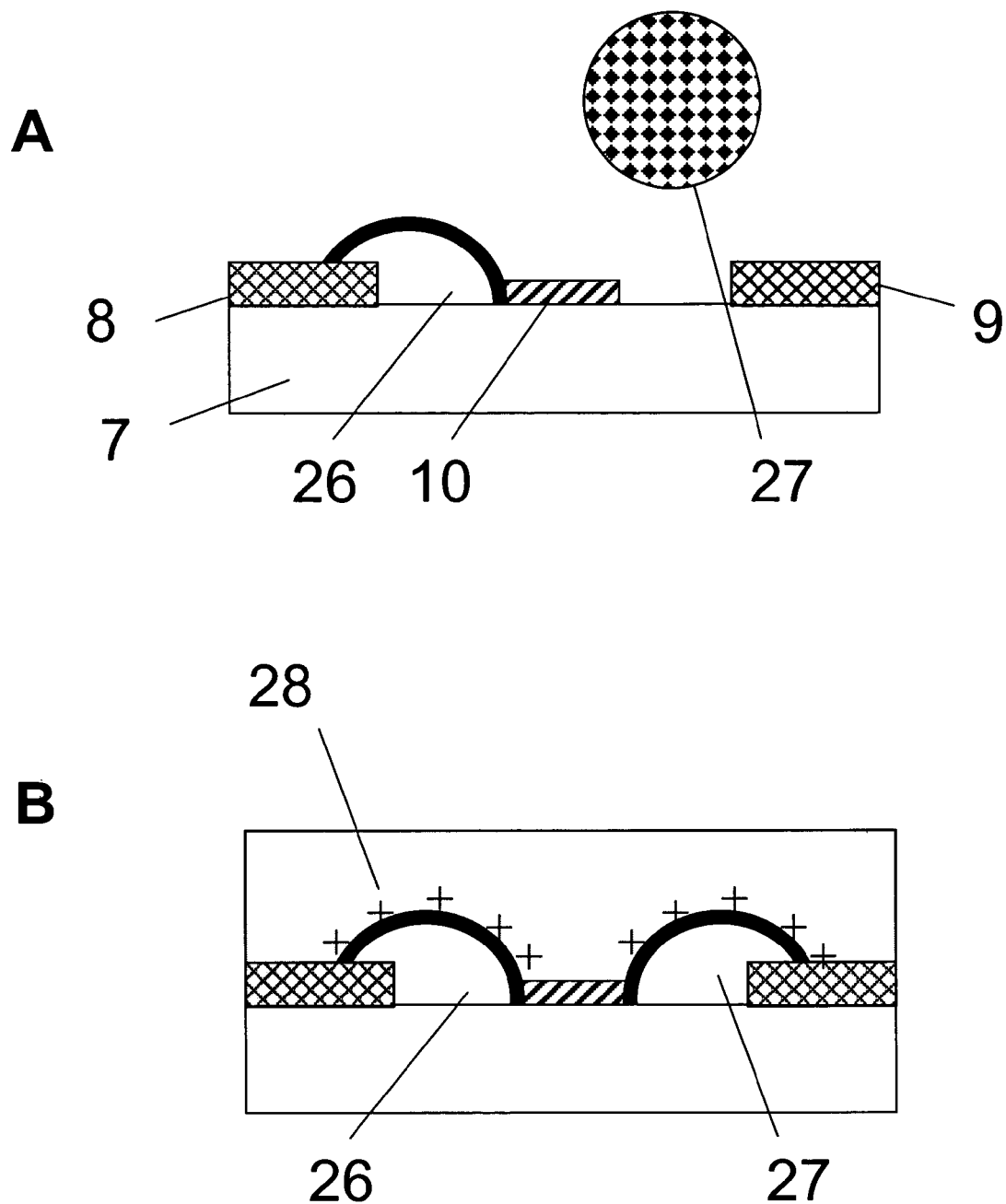
FIG. 6 shows a method for forming a self-aligned layer of dopants on the surface of the electrode by mixing a surfactant into the ink of the conducting electrode.

After depositing the conducting polymer pattern a solution of the semiconducting polymer 14, and 20, respectively, is deposited subsequently. Deposition techniques such as spin-coating, blade coating, dip coating, or direct write-techniques such as inkjet printing, screen printing, or offset printing may be used. After deposition of the semiconducting polymer the TFT device is completed by deposition of the gate dielectric layer 17 and the gate electrode 18. For the deposition of the gate electrode direct write techniques for conducting polymers or inorganic metals, such as inkjet printing, laser forward transfer printing, offset or screen printing may be used, as well as more conventional photolithography or other patterning techniques. The semiconducting layer might be either patterned into an active layer island (as in FIGS. 2 and 3) or it may be deposited as a continuous film over the substrate (as in FIG. 5 to 7).

A conducting polymer suitably consists of a conjugated polymer that is doped by mixing it with a counterion that is capable of either directly oxidizing (p-type) or reducing (n-type) the conjugated polymer or that is capable of stabilizing mobile charges on the chains of the conjugated polymer that have been generated during the synthesis of the conjugated polymer. The counterion can be a small molecular dopant or a polymeric dopant. Examples of polymeric dopants that are capable of oxidizing conjugated polymers such as polyethylenedioxythiophene (PEDOT) are poly(styrene sulfonic acid) (PSS), poly(ethylene-co-methacrylic acid) (PEMAA), or poly(acrylic acid) (PAA). In many cases a counterion with a relatively high molecular weight is desirable because a higher molecular weight reduces the tendency of the counterion to diffuse out of the conducting polymer layer into other layers of the device, which can give rise to undesirable changes of device characteristics under long-time operation. It is known that at the direct interface between PEDOT/PSS and many semiconducting conjugated polymers the acidic PSSH groups result doping of the semiconducting polymer the is in direct contact with the PEDOT/PSS surface (Arias, Phys. Rev. B 60, 1854, 1999).

It has been shown by Sirringhaus et al. (Science 290, 2123 (2000)) that polymer TFTs fabricated with poly(dioctylfluorene-co-bithiophene) F8T2 and PEDOT/PSS source-drain electrodes exhibit a lower contact resistance than devices fabricated with gold source-drain electrode, although PEDOT has a slightly lower workfunction than gold. This observation is interpreted as being due to the formation of a doped interfacial layer at the PEDOT/PSS—F8T2 interface. However, in the case of PEDOT doped with a polymeric counterion of PSS this interfacial region is very narrow, since the PSS polymeric counterion cannot diffuse into the semiconducting layer, i.e. doping just occurs in the region where the semiconducting polymer is in direct contact with the PEDOT/PSS.

The present application discloses techniques by which such doping can be enhanced and an interfacial region 15 and 16 of finite thickness (FIG. 2) of the semiconducting polymer around the conducting polymer electrodes 11 and 12, respectively, is formed, that is highly doped. These self-aligned, highly doped regions 15 and 16 then act as highly efficient injecting source and drain contacts into the intrinsic semiconducting polymer in the channel of the TFT.

In one embodiment a highly doped interfacial layer is formed when the semiconducting polymer is deposited on top of a metallic interconnect that contains a dopant molecule that is able to diffuse out of the metallic interconnect into the semiconducting polymer.

In such an embodiment an oligomeric dopant molecule may be added to a conducting polymer ink formulation such as PEDOT/PSS that form the source-drain interconnects. In the case of PEDOT/PSS a suitable dopant molecule is an oligomer of PSS, that is sufficiently short, that it is able to diffuse into the semiconducting layer.

Figure 4:
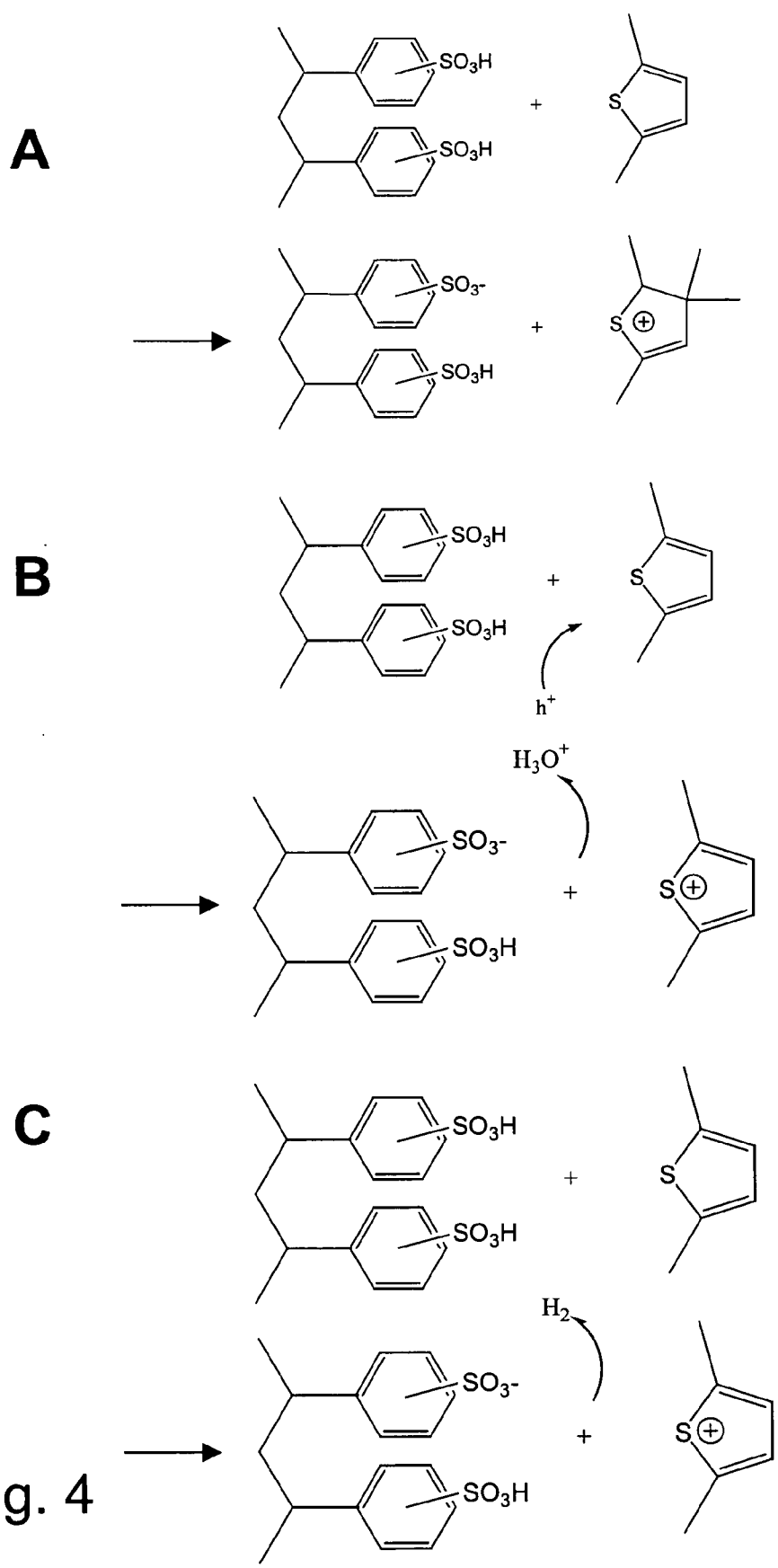
FIG. 4 illustrates possible mechanisms for doping of a conjugated polymer in the presence of a polystyrene sulphonic acid counterion (A—protonation doping; B—doping by hole injection, C—direct doping).

Without wanting to be bound by theory possible mechanisms for this doping are illustrated in FIG. 4. In FIG. 4A the doping mechanism is chemical doping, that occurs by protonation. In FIG. 4B, the doping occurs during operation of the device when hole carriers are injected into the device from the electrodes, and are stabilized on the polymer chain by the favourable electrostatic interaction with the negative counterions on the PSS. In FIG. 4C doping occurs by direct oxidation of the polymer by the acidic negative $SO_3^-$ functional groups of the PSS.

We have also found that in double layer structures in which a semiconducting layer is deposited on top of a layer of PSS a significant increase of the conductivity of the F8T2 occurs. In these experiments the PSS was annealed at a temperature of 200° C. prior to deposition of the F8T2 in order to minimize any ionic current flow in the PSS. While reference films fabricated with pure F8T2 as well as pure PSS showed very low conductivity, the F8T2/PSS bilayer films showed significant level of conductivity, indicative of doping at the PSS/F8T2 interface. These experiments yield evidence that even the direct doping reaction (FIG. 4C) of F8T2 in the presence of PSS might occur.

According to the preferred aspects of the present invention, a significant improvement of the contact resistance can be achieved by mixing a counterion dopant into the conducting polymer ink that is able to diffuse into the semiconducting polymer forming a highly doped interfacial region with a finite thickness exceeding 1 nm. In one embodiment of the invention the diffusion of the dopant can be induced during an annealing step at elevated temperature of typically 50–300° C. after the deposition of the semiconducting polymer. In order to enhance the mobility of the dopant such annealing step can also be performed under a solvent atmosphere. The diffusion profile can be controlled with the molecular weight of the dopant molecule. The lower the molecular weight of the dopant the deeper the diffusion profile. In many cases there is a compromise between efficient source-drain injection, and other performance attributes of the device such as low OFF current, and device stability. In one embodiment of the invention the counterion is an oligomer of styrene sulphonic acid, ethylene-co-methacrylic acid or acrylic acid. The number n of monomer units of the oligomer can be chosen such as to achieve the desired diffusion profile at the annealing temperature at which the diffusion is driven. n should be sufficiently large that under typical operating conditions of the device no further significant diffusion occurs, and that the width of the doped region surrounding the conducting polymer electrodes is small compared to the channel length, i.e. typically less than 10% of the distance between the two conducting polymer electrodes.

An alternative method to drive the diffusion of the dopants into the semiconducting layer is to apply a current stress to the device, such that positive (negative) charge carriers are injected into the device from the source-drain electrodes. The presence of a space charge of injected carriers near the electrodes will enhance the diffusion of negatively (positively) charged dopants out of the electrodes, as the electrostatic repulsion that they would otherwise experience can be compensated for by the presence of the oppositely charged injected carriers.

An alternative method to induce the diffusion is to deposit the semiconducting polymer from a solution in a solvent or a mixture of solvents in which the dopant has a small, but finite solubility, such that during the deposition of the semiconducting polymer dopant molecules near the surface of the conducting polymer electrodes are dissolved into the solution of the semiconducting polymer and diffuse into the semiconducting polymer. In this case the diffusion profile can be controlled with the solubility of the dopant molecules in the solvent of the semiconductor ink. The solubility should be sufficiently small that the dopant molecules are not uniformly distributed in the solution of the semiconducting polymer. The dissolution rate should be sufficiently small that dissolution effectively occurs in the later stages of film growth where the characteristic time constant for diffusion of dopants in the concentrated semiconductor solution is smaller than the time constant associated with the drying of the film.

Examples of such dopants are molecules containing both polar and apolar side chains. The requirement is that the dopant molecule is soluble both in a solvent that is miscible with the solvent that is used for the deposition of the conducting polymer, and in a solvent that is miscible with the solvent that is used for the deposition of the semiconducting polymer. Alternatively, the codeposition of the conducting polymer and the dopant molecule can be performed using surfactant additives to the conducting polymer ink. The aliphatic tails of the surfactant stabilize, for example, a nonpolar dopant molecule inside a polar solution of the conducting polymer such as a water solution of PEDOT/PSS.

The methods described above can also be applied in order to enhance the injection into the semiconducting material from inorganic electrodes solution-deposited using nanoparticle or chemical precursor inks.

The source-drain injection efficiency can be improved by modification of the surface roughness of the electrode to promote interfacial contact between the metallic electrode and the semiconducting layer. In contact with a microporous electrode the interfacial area that is available for charge injection into the semiconducting polymer can be increased significantly. This is particularly important in device configuration in which the source-drain electrodes and the accumulation layer are on the same side of the semiconducting polymer film, because in such configurations the injected current flow is confined to a very thin layer at the interface between the electrodes and the gate dielectric. Furthermore in the case of an electrode at which there is a doping interaction between the semiconducting polymer and the material of the conducting electrode, such as in the case of PEDOT/PSS, the larger the interfacial contact area is the more efficient the doping of the semiconducting polymer in contact with PSS.

The surface roughness of the electrodes can be enhanced prior to deposition of the semiconducting material by a variety of techniques such as oxygen plasma etching or mechanical treatment of the electrodes such as mechanical rubbing. In one preferred embodiment of the invention a polymer additive is mixed into the solution of the conducting material (see FIG. 5). The polymer additive is chosen such that upon drying it forms a phase separated network with the conducting material 22,23. The polymer might also have a tendency to phase separate vertically. An example of such a polymer additive is polyvinylphenol (PVP) that can be codeposited with PEDOT/PSS from a solvent mixture of water and isopropanol. A suitable concentration of PVP:PEDOT/PSS is 10%. Prior to deposition of the semiconducting polymer the polymer additive near the surface of the electrode is redissolved by exposing the surface of the electrodes to a solvent in which the conducting material is not soluble, but in which the polymer additive is soluble, such as isopropanol in the case of dried PEDOT/PSS. In this way a microporous surface 24 is formed. The porosity, and the depth of the porous layer can be controlled with the original phase separated microstructure (that can for example be controlled by annealing treatment or suitable choice of solvents), by the time and temperature conditions of the solvent exposure step, or by the choice of the solvent. When a semiconducting polymer is deposited subsequently onto such a microporous electrode, it penetrates into the pores on the surface and comes into intimate contact with the conducting electrode material resulting in enlarged interface area as well as doping efficiency.

It should be pointed out, however, that the micro-roughness of the electrode should ideally be sufficiently small that other device performance attributes such as leakage currents through the dielectric layer or the uniformity of film deposition of the semiconducting material are not adversely affected.

The conducting material can be deposited in the form of an ink. A small concentration of semiconducting polymer can be added to the (e.g.) ink of the conducting material, either by directly dissolving the semiconducting material in the conducting ink solvent, or by mixing in a cosolvent miscible with the solvent of the conducting ink, or by dispersing the semiconducting material inside the conducting polymer ink using a surfactant. When the ink dries after deposition, the semiconducting polymer has a tendency to segregate to the surface (due to its less polar nature), and near the surface a mixed layer 13, 19 of conducting and semiconducting material is formed in which effective doping of the semiconducting material occurs. The semiconducting polymer may be the same polymer that is used as the active layer of the device, or it may be a different polymer.

Alternatively, layer 13, 19 can be a self-aligned layer of dopants and/or layer of defined surface charge formed by mixing the ink of the conducting electrode material with a surface active molecule, or by selectively modifying the surface after deposition of the conducting electrodes.

In one embodiment of this aspect of the invention (FIG. 6) the ink of the metallic electrode material 27 is mixed with a surfactant dopant or with a dopant molecule that is stabilized within the conducting ink with the help of a surfactant. A surfactant dopant is a molecule that comprises both a polar head group as well as a non-polar aliphatic or fluorinated tail group. The polar head group can provide the dopant functionality directly, or the dopant functionality can also be incorporated by attaching a functional group to the surfactant that is capable of oxidizing or reducing the semiconducting polymer. The surfactant molecule is surface active and migrates to the surface in order to expose its aliphatic tails to the surface and lower the surface energy. In this way a self-aligned surface layer of dopant molecules 28 is formed on the surface of the electrodes 26, 27.

In the case of PEDOT/PSS and p-type doping of the semiconductor a suitable surfactant dopant is an anionic surfactant that contains a negatively charged sulphonic acid head group, and an alkyl or fluoroalkyl side chain. In the case of n-doping a preferred embodiment of the invention is a cationic surfactant that contains a positively charged head group, and an alkyl or fluoroalkyl side chain. Suitable surfactants are known in the literature. The concentration of the surfactant in the conducting ink should be chosen in order to maximise the surface activity of the surfactant and minimize any interactions of the surfactant with the conducting material, that might deteriorate the conducting properties. In one preferred embodiment of the invention the concentration of the surfactant is chosen to be near the critical micelle concentration.

The molecular weight of the surfactant should be chosen in order to maximise the surface activity, while at the same time ensuring that the thin layer of nonpolar, insulating tails of the surfactant does not affect adversely the charge injection. The molecular weight should be high enough in order to prevent uncontrolled diffusion of the surfactant into the other layers of the device. In one preferred embodiment of the invention the surfactant is a polymeric surfactant.

The surfactant may be a surfactant that is not a direct dopant, but an indirect dopant, for example a surfactant that has a permanent dipole moment, such as an amphoteric surfactant, or (in the case of hole injection) a cationic surfactant with a strongly electronegative tail group such as a fluorinated tail group. On a negatively charged PSS-rich PEDOT/PSS surface the positive head groups of the surfactant are directed towards the surface such that the dipole moment of the surfactant is helping the hole injection process.

In contrast to the familiar modification of metal surface by exposure of the surface to thiol-based self-assembling molecules the surfactant layer forms automatically during the deposition process of the conducting electrode, and is self-aligned with the conducting electrode. The interaction of the surfactant with the polymer surfaces is of an ionic origin, and provides a means for achieving a densely packed surface layer of surfactants in contrast to thiol or trichlorosilance based self-assembling molecules that require specific functional groups on the surface for binding, and on polymer surfaces usually do not grow into densely packed layers.

The surface layer of dopants or dipolar surfactants may be deposited (preferably deposited selectively) on to the surface of one or both predeposited conducting electrode(s). Selective deposition implies that the dopant deposits only on top of the conducting electrodes, but not on top of the bare substrate surface, in particular not in the channel of the TFT.

Such selective deposition may be achieved by depositing an ionic dopant from solution or from the vapour phase onto the charged surface of a conducting polymer electrode while the bare substrate surface is either uncharged or charged with the same polarity as that of the ionic dopant/surfactant. The substrate surface can be modified accordingly by deposition of a self-assembled monolayer prior to the deposition of the conducting electrode. This ensures that deposition of the dopant is selective and only occurs on top of the conducting electrode. The conducting polymer PEDOT/PSS consists of a blend of a positively charged conjugated polymer (PEDOT) and a negatively charged counterion (PSS). This results in a surface that exposes a large number of charged groups that can be used to bind the dopant molecules by electrostatic interaction. The PSS component has a tendency to surface segregate, resulting in a negatively charged surface, in particular after annealing of an as-deposited PEDOT/PSS film at temperatures exceeding 150° C.

One of the techniques that can be used to self-assemble a surface layer of dopants onto an electrode of PEDOT/PSS is that of polyelectrolyte self-assembly [Decher, Science 277, 1232 (1997)]. Polyelectrolyte self-assembly has been used previously to improve the charge injection into a polymer light-emitting diode by building a graded injection multi-layer structure with a sequence of polymer of increasing energy gap in order to reduce the injection barriers from the anode into the hole transport layer (Ho, Nature 404, 481 (2000)). Here we disclose a technique by which a self-assembled doped layer can be formed using polyelectrolyte self-assembly. The PEDOT/PSS is prepared with a well-defined surface charge, either by inducing the segregation of either the PSS or the PEDOT component to the surface or by treating the surface with a self-assembled monolayer comprising a charged tail group. Such a charged surface is then dipped into a polyelectrolyte solution comprising an ionic polymer with charged groups that bind to the charged groups on the PEDOT/PSS surface. This process can be used to build multilayer structures consisting of alternating layer of polyanions and polycations. The polyanions and polycations are chosen such that they exhibit conducting or semiconducting properties in order not to result in a barriers for charge transport. One or more of the polyanion or polycation layers, most preferably the outermost layer, comprises functional groups that are able to oxidize/reduce the semiconducting polymer. In the case of PEDOT/PSS such functional group can be a group of styrene sulphonic acid, and the polyanion may be PSS itself.

The injection efficiency may also be enhanced by assembling a layer of a conducting-semiconducting blockcopolymer on the surface of the metallic interconnect prior to deposition of the semiconducting layer.

Figure 7:
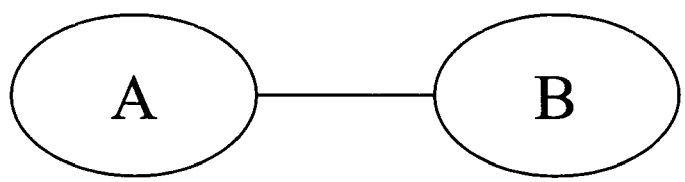
FIG. 7 shows a method for forming a layer of di-blockcopolymer on the surface of the electrode material, the blockcopolymer consisting of a conducting block A and a semiconducting block B.
Figure 7:
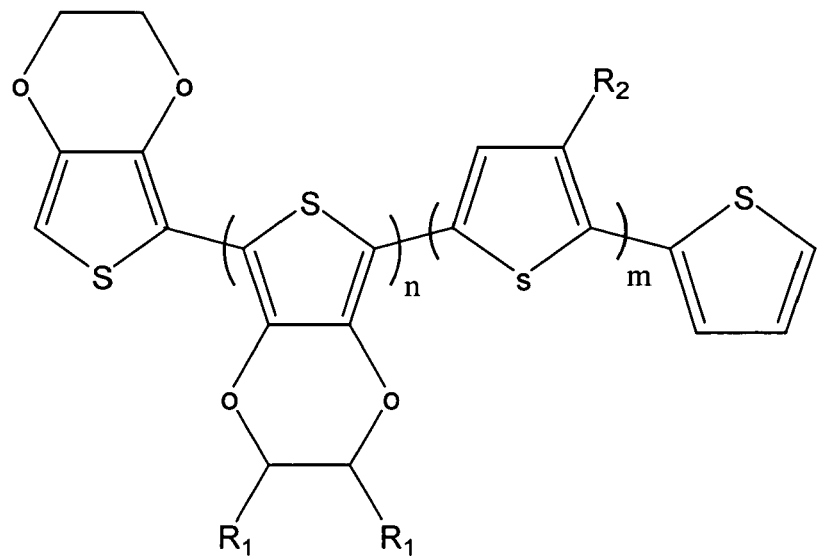
Figure 7:
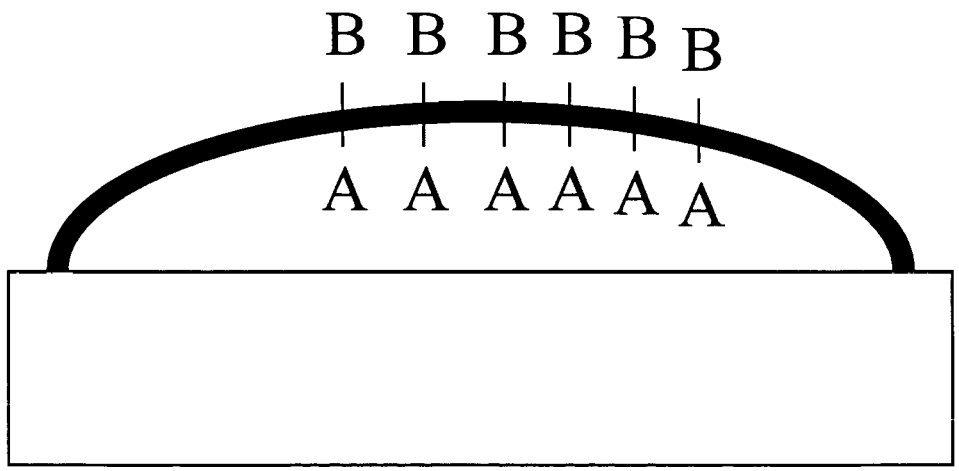

The di-blockcopolymer consists of a first conducting or at least easily oxidizable (reducible) block A with a low ionisation potential (high electron affinity, respectively), and of a semiconducting block B with a higher ionisation potential (low electron affinity) (FIG. 7). In a preferred embodiment of the invention the semiconducting block is of the same chemical structure as the semiconducting polymer that forms the active layer of the TFT. The semiconducting block may for example be an oligomer or polymer of regioregular hexylthiophene or dioctyl-fluorene-co-bithiophene. The conducting block maybe an oligomer of ethylene-dioxythiophene.

The blockcopolymer is assembled in a lamellar structure onto the surface of the conducting electrodes in such a way that the conducting block A is directed towards the bulk of the conducting electrode, and the semiconducting block B is in contact with the semiconducting layer.

Without wanting to be bound by theory the mechanism for the improved injection in this case is believed to be the existence of a covalent bond and the generally close contact between the conducting and semiconducting block, that will facilitate doping and/or charge injection from the conducting into the semiconducting material.

The lamellar structure can be fabricated by mixing the blockcopolymer into the conducting ink and inducing a vertically phase separated structure upon drying with the apolar semiconducting block of the blockcopolymer segregated to the surface. The apolar nature of the semiconducting block and the more polar nature of the conducting block will favour such vertically phase separated in which the surface energy is lowered by exposing the apolar semiconducting block to the surface. In another embodiment of the invention the lamellar surface layer of the blockcopolymer is deposited selectively after the deposition of the conducting electrodes by techniques analogous to those described above, by making use of the binding of the polar block to the surface of the conducting electrode.

In a preferred embodiment the blockcopolymer is a di-blockcopolymer. However, tri-blockcopolymers or higher blockcopolymers may also be used.

The methods for improving carrier injection into organic semiconductors disclosed herein can be used for the fabrication of high performance TFTs (thin-film transistors), as well as TFT circuits such as logic circuits, sensor circuits, and active matrix displays. They may also be used in other organic electronic devices which require efficient electron and hole injection such as light-emitting diodes, or rectifying diodes.

The techniques can also be applied to devices in which the semiconducting material is an inorganic semiconductor deposited from solution, such as silicon or CdSe deposited using chemical precursor solutions or nanocrystal dispersions.

The present invention is not limited to the foregoing examples. Aspects of the present invention include all novel and/or inventive aspects of the concepts described herein and all novel and/or inventive combinations of the features described herein.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. An electronic device formed on a substrate and comprising:
   a first electrode constituted by a first electrically conductive region;
   a second electrode constituted by a second electrically conductive region and spaced away from the first electrode;
   a layer of a semiconductor material between the first and second electrodes and in contact with the first electrically conductive region, there being an interfacial zone comprising least part of the periphery of the semiconductor material at the interface between the semiconductor material and the first electrically conductive region in which the semiconductor material is doped by a dopant integral with the first electrically conductive region so as to have a higher electrical conductivity than the interior of the semiconductor materials,
   wherein said interfacial zone has a thickness of at least 1 nm.

2. An electronic device as claimed in claim 1, wherein the semiconductor material is doped by a dopant that is an oligomer of an organic molecule comprising an acid functional group.

3. An electronic device as claimed in claim 2, wherein the oligomer is an oligomer of an organic molecule containing a sulphonic acid group.

4. An electronic device as claimed in claim 1, wherein the dopant is a surface active dopant.

5. An electronic device as claimed in claim 4, wherein the surface active dopant is a surfactant.

6. An electronic device as claimed in claim 1 wherein the first electrically conductive region has a roughened surface at its interface with the semiconductor material.

7. An electronic device as claimed in claim 1, wherein the first electrically conductive region comprises molecules of an organic semiconductor material.

8. An electronic device as claimed in claim 1, wherein the first electrically conductive region comprises molecules of a block copolymer having one or more electrically conductive blocks and one or more semiconducting blocks.

9. An electronic device as claimed in claim 1, comprising a layer of the dopant between the first electrically conductive region and the semiconductor material.

10. An electronic device as claimed in claim 1, wherein at least one of the first and second electrically conductive regions comprises an electrically conductive polymer.

11. An electronic device as claimed in claim 10, wherein the electrically conductive polymer is PEDOT/PSS.

12. An electronic device as claimed in claim 1, wherein at least one of the first and second electrically conductive regions comprises a metal deposited from solution.

13. An electronic device as claimed in claim 12, in which the metal is silver, gold, or copper.

14. An electronic device as claimed in claim 1, wherein the semiconductor material is an organic semiconductor.

15. An electronic device as claimed in claim 14, wherein the semiconductor material is a conjugated polymer.

16. An electronic device as claimed in claim 1 wherein the semiconductor material is an inorganic semiconductor.

17. An electronic device as claimed in claim 16, wherein the inorganic semiconductor is silicon or cadmium selenide.

18. An electronic device as claimed in claim 1, wherein the ionization potential of the conjugated polymer is less than 5.8 eV.

19. An electronic device as claimed in claim 1, wherein the electronic device is a switching device.

20. An electronic device as claimed in claim 1, wherein the switching device is a transistor and the electrodes are source and drain electrodes of the transistor.

21. An electronic device as claimed in claim 1, wherein the semiconductor material remains undoped by the dopant internally of the interfacial zone.

22. An electronic device as claimed in claim 1, wherein the thickness of the interfacial zone is between 1 nm and 100 nm.

23. An electronic device as claimed in claim 1, wherein the thickness of the interfacial zone is between 10 nm and 1 μm.

24. An electronic device as claimed in claim 1 or 23, wherein the thickness of the interfacial zone is between 100 nm and 3 μm.

25. An electronic device as claimed in claim 1, wherein the concentration of the dopant in the interfacial zone is higher than $10^{17} cm^{-3}$.

* * * * *